United States Patent
Vinassa et al.

(10) Patent No.: US 10,036,781 B2
(45) Date of Patent: Jul. 31, 2018

(54) METHOD AND APPARATUS FOR EVALUATING THE STATE OF HEALTH OF A LITHIUM BATTERY

(71) Applicants: CENTRE NATIONAL DE LA RECHERCHE SCIENTIFIQUE, Paris (FR); UNIVERSITE DE BORDEAUX, Bordeaux (FR); INSTITUT POLYTECHNIQUE DE BORDEAUX, Pessac (FR)

(72) Inventors: Jean-Michel Vinassa, Gradignan (FR); Akram Eddahech, Talence (FR); Olivier Briat, Bordeaux (FR)

(73) Assignees: Centre National de la Recherche Scientifique, Paris (FR); Universite de Bordeaux, Bordeaux (FR); Institut Polytechnique de Bordeaux, Pessac (FR)

(*) Notice: Subject to any disclaimer, the term of this patent is extended or adjusted under 35 U.S.C. 154(b) by 122 days.

(21) Appl. No.: 15/026,241

(22) PCT Filed: Oct. 1, 2014

(86) PCT No.: PCT/EP2014/071065
§ 371 (c)(1),
(2) Date: Mar. 30, 2016

(87) PCT Pub. No.: WO2015/049300
PCT Pub. Date: Apr. 9, 2015

(65) Prior Publication Data
US 2016/0245876 A1 Aug. 25, 2016

(30) Foreign Application Priority Data
Oct. 1, 2013 (FR) .................................. 13 59508

(51) Int. Cl.
*H02J 7/04* (2006.01)
*H02J 7/16* (2006.01)
(Continued)

(52) U.S. Cl.
CPC ...... *G01R 31/3679* (2013.01); *B60L 11/1857* (2013.01); *G01R 31/3651* (2013.01);
(Continued)

(58) Field of Classification Search
CPC .. H02J 7/0047; H02J 7/0091; H02J 2007/005; H02J 7/0022; H02J 7/0086
(Continued)

(56) References Cited

U.S. PATENT DOCUMENTS 8,258,756 B2 * 9/2012 Lim ...................... H02J 7/0031
320/128
2001/0022518 A1 * 9/2001 Asakura ............. G01R 31/3679
324/426
(Continued)

FOREIGN PATENT DOCUMENTS

| EP | 2 530 478 A2 | 12/2012 |
| FR | 2 977 678 A1 | 1/2013 |
| WO | 2013/128635 A1 | 9/2013 |

OTHER PUBLICATIONS

T. Hang et al., "Electrochemical impedance spectroscopy analysis for lithium-ion battery using Li4Ti5O12 anode," Journal of Power Sources, vol. 222, 2013, pp. 442-447.
(Continued)

*Primary Examiner* — Nghia Doan
(74) *Attorney, Agent, or Firm* — Baker Hostetler LLP

(57) ABSTRACT

A method for assessing the health of a lithium battery comprising: a first step of recharging the battery at constant current, until the voltage at its terminals reaches a limit value; a second step of recharging the battery at constant
(Continued)

voltage equal to the limit value, until the charging current drops below a threshold value, a plurality of measurements of the charging current being acquired during the second recharging step; and a step of estimating the state of health of the battery from at least one parameter of the second step of recharging at constant voltage, such as the parameter expressing the decrease of an exponential function interpolating charging current measurements, the energy supplied to the battery during the second step of recharging at constant voltage or the duration of the step of charging at constant voltage. A battery management system comprising an apparatus for implementing the method is provided.

7 Claims, 4 Drawing Sheets

(51) Int. Cl.
    *G01R 31/36*     (2006.01)
    *B60L 11/18*     (2006.01)
    *H02J 7/00*     (2006.01)

(52) U.S. Cl.
    CPC ........ *G01R 31/3665* (2013.01); *H02J 7/0052* (2013.01); *G01R 31/3624* (2013.01); *H02J 7/0047* (2013.01); *H02J 7/0075* (2013.01); *Y02T 10/705* (2013.01); *Y02T 10/7011* (2013.01)

(58) Field of Classification Search
    USPC .......................................... 320/132, 160–162
    See application file for complete search history.

(56) References Cited

U.S. PATENT DOCUMENTS

2012/0130661 A1*   5/2012   Hagimori ........... G01R 31/3624
                                                             702/63
2012/0306450 A1   12/2012   Nakayama et al.
2013/0166234 A1    6/2013   Chuo et al.

OTHER PUBLICATIONS

Eddahech et al., "Ageing monitoring of lithium-ion cell during power cycling tests," Microelectronics Reliability Journal, vol. 51, No. 9-11, 2011, pp. 1968-1971.

W.X. Shen et al., "A new battery available capacity indicator for electric vehicles using neural network," Energy Conversion and Management, vol. 43, No. 6, 2002, pp. 817-826.

S. Wang et al., "Multi-parameter battery state estimator based on the adaptive and direct solution of the governing differential equations," Journal of Power Sources, vol. 196, 2011, pp. 8735-8741.

Eddahech et al., "Real-Time SOC and SOH Estimation for EV Li-Ion Cell Using Online Parameters Identification," Proceedings of IEEE Energy Conversion Congress and Exposition Conference, 2012, pp. 4501-4505.

Akram Eddahech et al., "Determination of lithium-ion battery state-of-health based on constant-voltage charge phase," Journal of Power Sources, vol. 258, Feb. 15, 2014, XP028604616.

\* cited by examiner

METHOD AND APPARATUS FOR EVALUATING THE STATE OF HEALTH OF A LITHIUM BATTERY

CROSS-REFERENCE TO RELATED APPLICATIONS

This application is a National Stage of International patent application PCT/EP2014/071065, filed on Oct. 1, 2014, which claims priority to foreign French patent application No. FR 1359508, filed on Oct. 1, 2013, the disclosures of which are incorporated by reference in their entirety.

FIELD OF THE INVENTION

The invention relates to a method for assessing the "state of health" of a lithium battery, and notably the loss of capacity caused by the aging of such a battery.

The invention relates also to an apparatus for implementing such a method and to a battery management system incorporating such an apparatus.

The invention applies notably, but not exclusively, to the field of batteries for powering electric or hybrid land vehicles.

BACKGROUND

The lithium batteries or accumulators—in their different variants such as the "lithium-ion", "lithium-ion-polymer", "lithium-metal-polymer" and other such batteries—are the batteries exhibiting the greatest energy density and the greatest specific energy. It is therefore the technology of choice for powering electric or hybrid vehicles, but also many portable devices. However, it is known that these batteries show a degradation of their performance levels—and notably of their capacity—over time, and do so even during the periods of non-use (then referred to as "calendar aging"). Consequently, the estimating of the state of health (or SOH) of these batteries—quantified for example by the current capacity related either to its advertised ("commercial") value, or to its value measured when new—constitutes one of the most important tasks of the battery management systems (BMS) present in all the electric or hybrid vehicles.

This task is not easy. A number of techniques have been developed to accomplish it but not one gives full satisfaction.

Electrochemical impedance spectroscopy is a technique that is very useful for studying the aging of the batteries through the tracking of the parameters of an impedance model. However, it is complex to implement, costly and does not make it possible to access the capacity. Furthermore, it cannot be embedded in a BMS. In this respect, see:

T. Hang, D. Mukoyama, H. Nara, N. Takami, T. Momma and T. Osaka, "*Electrochemical impedance spectroscopy analysis for lithium-ion battery using Li4Ti5O12 anode*", Journal of Power Sources, vol. 222, pp. 442-447, 2013; and A. Eddahech, O. Briat, H. Henry, J.-Y. Delétage, E. Woirgard and J.-M. Vinassa, "*Aging monitoring of lithium-ion cell during power cycling tests*", Microelectronics Reliability Journal, vol. 51, N° 9-11, pp. 1968-1971, 2011.

Other methods, better suited to online use, exploit the techniques of artificial intelligence, such as neural networks or fuzzy logic. See for example W. X. Shen, C. C. Chan, E. W. C. Lo and K. T. Chau, "*A new battery available capacity indicator for electric vehicles using neural network*", Energy Conversion and Management, vol. 43, no. 6, pp. 817-826, 2002.

These methods implement complex algorithms, which require a significant computation power. Furthermore, they require a lengthy learning step.

Other techniques are based on identifying parameters of a model, for example by Kalman filtering. See for example:

S. Wang, M. Verbrugge, J. S. Wang and P. Liu, "*Multi-parameter battery state estimator based on the adaptive and direct solution of the governing differential equations*", Journal of Power Sources, vol. 196, pp. 8735-8741, 2011; and A. Eddahech, O. Briat and J. M. Vinassa, "*Real-Time SOC and SOH Estimation for EV Li-Ion Cell Using Online Parameters Identification*", in Proc. IEEE Energy Conversion Congress and Exposition conf., 2012, Raleigh, N.C., United States.

These techniques use complex identification algorithms, requiring serious digital processing. Furthermore, the implementation thereof presupposes the availability of a fine and accurate model of the battery.

The document US 2001/0022518 teaches a method for estimating the state of health of a battery from the time $t_{1/2}$ necessary for the charging current of said battery to be divided by two during the constant voltage phase of a recharge of the "constant current—constant voltage" type. This document does however show that the relationship between $t_{1/2}$ and the state of health is not a one-to-one relationship.

The document FR 2 977 678 discloses a similar method, in which the state of health is estimated from the time needed for the current to cross two thresholds—defined arbitrarily—during said constant voltage charging phase.

SUMMARY OF THE INVENTION

The invention aims to overcome the abovementioned drawbacks and to obtain a method for assessing the state of health of a lithium battery which is at the same time simple to implement, reliable and accurate without in any way extending the recharging phase or provoking any additional aging.

According to the invention, this aim is achieved by estimating the state of health of a battery from the simple observation of the constant voltage step of its recharge. "Recharge" should be understood to be the operation consisting in fully or almost fully charging (for example, 95% or more of the available capacity) after a period of use, as opposed to partial "charges" that can occur during use (for example, in the case of an electric vehicle, when braking with energy recovery).

One subject of the invention is therefore a method for assessing the state of health of a lithium battery comprising:

a) a first step of recharging said battery at constant current, until the voltage at its terminals reaches a limit value; then b) a second step of recharging said battery at constant voltage equal to said limit value, until the charging current drops below a threshold value; and c) a step of estimating the state of health of said battery from said measurements of the charging current acquired during said second step of recharging at constant voltage.

The method can comprise in particular the acquisition of a plurality of measurements of the charging current during said second step of recharging at constant voltage. Furthermore, said step c) can comprise the following substeps:

c1) estimating the constant of decrease B of a negative exponential function interpolating said measurements of the charging current; and c2) estimating said state of health from said constant of decrease B.

According to particular embodiments of the invention:
Said substep c2 can be implemented by means of a linear function linking said constant of decrease B to a loss of capacity of said battery.
Said battery can be a lithium-ion battery.
More particularly, said battery can be a nickel, manganese and cobalt (NMC) lithium-ion battery. In this case, the method can also comprise:
d) a step of detecting an inflection in a curve representing said measurements of the charging current acquired during said second step of recharging at constant voltage.

Another subject of the invention is an apparatus for assessing the state of health of a lithium battery comprising: a charger of the constant current—constant voltage type, adapted to charge one said battery at constant current until the voltage at its terminals reaches a limit value, then at constant voltage equal to said limit value until the charging current drops below a threshold value; a device for monitoring the recharging of said battery; and a data processing device configured or programmed to cooperate with said charger and with said monitoring device in order to implement such a method.

Yet another subject of the invention is a battery management system comprising such an apparatus.

BRIEF DESCRIPTION OF THE DRAWINGS

Other features, details and advantages of the invention will emerge on reading the description given with reference to the attached drawings given by way of example and which represent respectively.

DETAILED DESCRIPTION

Figure 1:
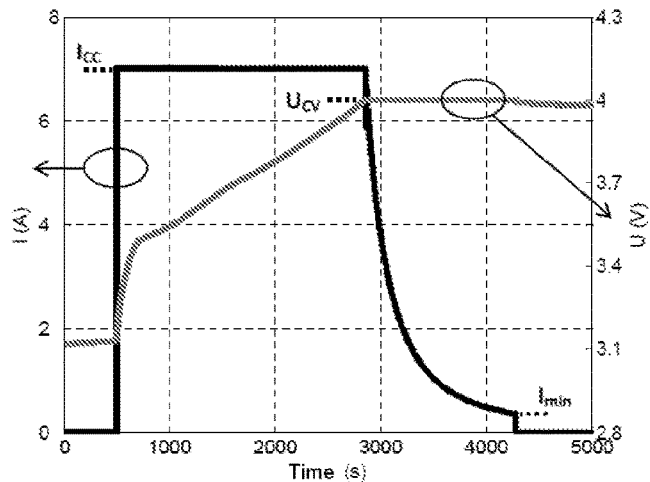
FIG. 1, the trend over time of the voltage and the charging current of a lithium battery during a constant current—constant voltage recharge.

Lithium batteries are generally charged by a so-called constant current-constant voltage (CC-CV) method. This method, illustrated in FIG. 1, consists in carrying out a first recharging phase during which a constant charging current $I=I_{CC}$ is supplied to the battery, the voltage U of which increases up to a maximum value $U_{CV}$; then in carrying out a second recharging phase during which the voltage U is kept constant and equal to $U_{CV}$, while the current I decreases. The recharging ends when the current I decreases to a minimum value $I_{min} < I_{CC}$ specific to the battery technology. The inventors found that the state of health of a battery can be assessed reliably from one or more parameters characterizing this second step of recharging at constant voltage ("CV step"). Thus, the estimating of the state of health is done during the recharging of the battery—necessary for its normal use—without the need for resource- and time-consuming dedicated measurement operations.

The inventors are in a position to offer a likely explanation of the fact—observed experimentally—that the observation of the step of recharging at constant voltage provides sufficient information to assess the state of health of a battery. In effect, one of the major mechanisms responsible for the degradation of the capacity of a lithium battery over time is the formation of a solid electrolyte interface (SEI) which presents an obstacle to intercalation of the lithium ions in the material of the anode and of the cathode. Now, this intercalation occurs mainly during the constant voltage step of the recharge.

Figure 2:
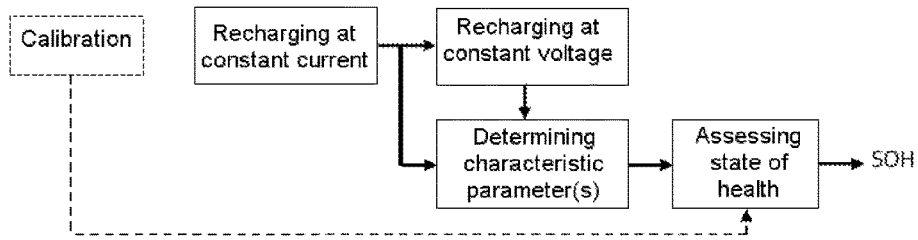
FIG. 2, the succession of steps of a method for assessing the state of health of a battery according to an embodiment of the invention.

FIG. 2 illustrates the succession of steps of a method according to the invention:
the first step of recharging at constant current;
the second step of recharging at constant voltage;
the measurement, determination or estimation of at least one parameter characteristic of this second step of recharging at constant voltage;
the determination of at least one SOH quantity indicative of the state of health of the battery (for example, its capacity related to the capacity of said battery when new, or to its advertised capacity) from said or from at least one said parameter. This latter step is made possible by a preliminary calibration step in which a relationship is established between said or each parameter and the state of health of the battery. The calibration entails a benchmark method for determining the state of health of the battery. This method can be, for example, a capacity measurement performed during a complete discharge of the battery ("discharged capacity" measurement).

For the determination of the state of health of the battery to be reliable, it is assumed that the recharging is performed at a temperature that is controlled (for example 25° C.) or at least known (in the latter case, the calibration has to make it possible to take account of the effect of the temperature on the relationship that exists between the parameter characterizing the step of recharging at constant voltage and the state of health).

Figures 3A, 3B:
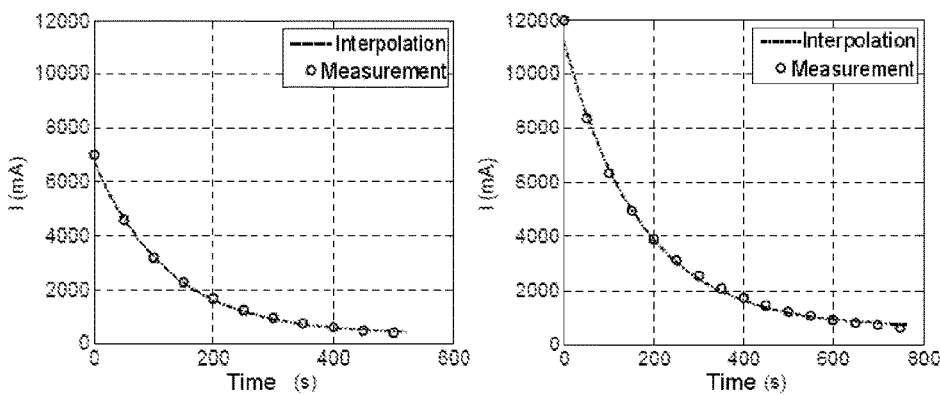
FIGS. 3A, 3B and 3C, the interpolation of the trend over time of the charging current during the step of recharging at constant voltage by a negative exponential function for three battery technologies with different states of aging.
Figure 3C:
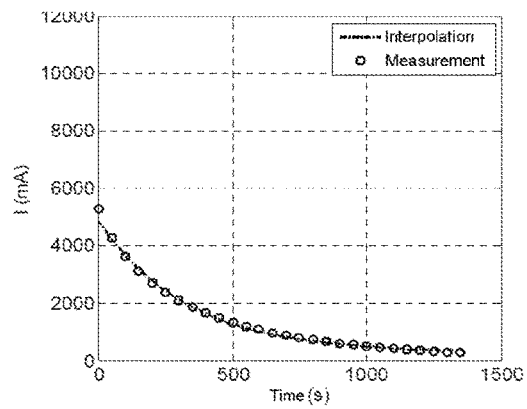

According to an embodiment of the invention, the parameter characterizing the step of recharging at constant voltage is the parameter expressing the decrease B of a negative exponential function $$I(t) = A \cdot e^{-Bt} + C$$

interpolating the trend of measured charging current I as a function of time t (t=0 corresponding to the start of the step of recharging at constant voltage). FIGS. 3A-3C make it possible to check the quality of such an interpolation, the continuous curves representing the interpolation function being practically superimposed on the measurement points. The three curves shown in these figures concern three lithium battery technologies—nickel cobalt aluminum (NCA, FIG. 3A), nickel manganese cobalt (NMC, FIG. 3B), lithium manganese oxide (LMO, FIG. 3C)—each being in a distinct state of health.

Figure 4A:
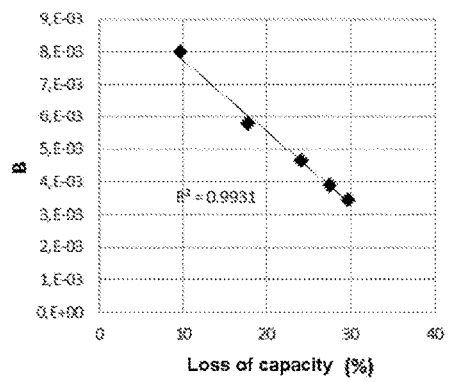
FIGS. 4A, 4B and 4C, the correlation between the parameter expressing the decrease of said negative exponential function and the loss of capacity for the three said above-mentioned battery technologies.
Figure 4B:
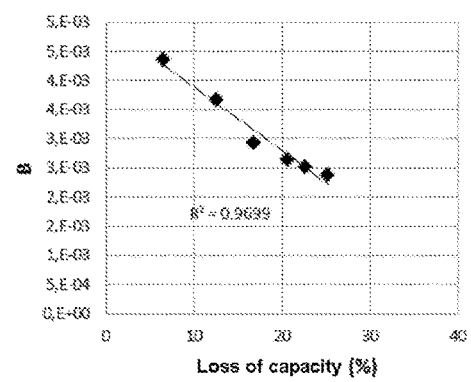
Figure 4C:
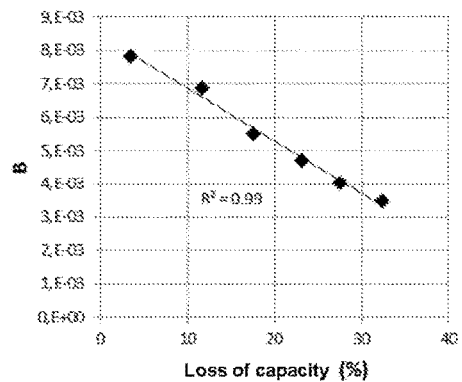

The parameter B can be linked to the loss of capacity of the battery, expressing its state of health, by a linear function, as illustrated by FIGS. 4A, 4B and 4C which correspond to the three curves of FIGS. 3A, 3B and 3C, respectively. These three examples are not limiting. In all cases, the quality criterion $R^2$ of the identification by the least squares method is very close to 1, which is very satisfactory.

The parameter B is revealed to be a much better indicator of the state of health of a battery than the time $t_{1/2}$ needed to divide the charging current by 2, used for example in the abovementioned document US 2001/0022518. In effect, as explained above, the relationship between $t_{1/2}$ and the state of health of the battery is neither linear nor one-to-one (two different states of health can be associated with the same value of $t_{1/2}$).

Figure 5:
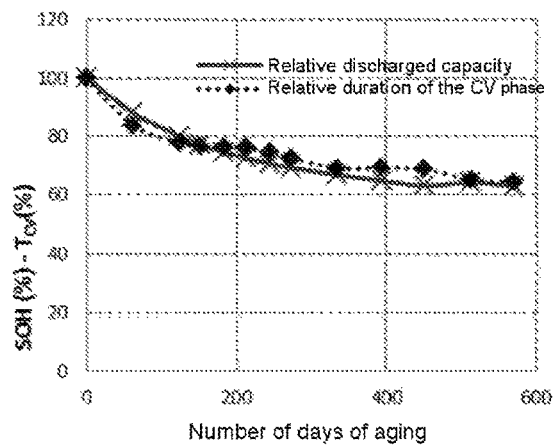
FIG. 5, the correlation between the relative discharged capacity and the relative duration of the phase of recharging at constant voltage.
Figure 6:
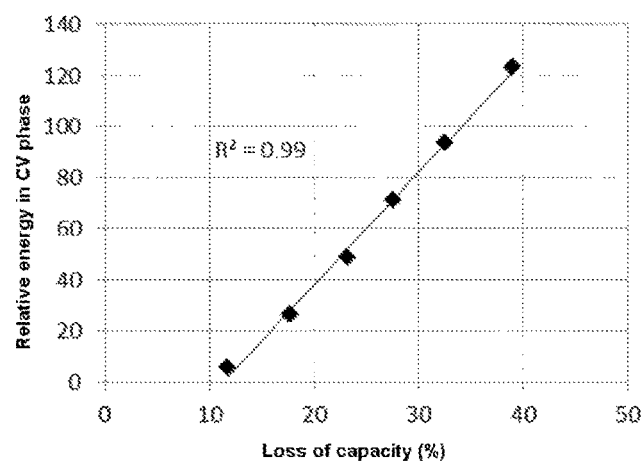
FIG. 6, a graph illustrating the correlation between the relative recharging energy at constant voltage and the loss of capacity for a lithium battery subject to aging.

In the case of a battery of LFP (lithium-iron phosphate) type, the state of health can more simply be determined from the measured duration of the step of recharging at constant voltage. More specifically, it is found that this measured duration, related to its duration during the initial recharge, is proportional to the state of health of the battery. FIG. 5, which relates to the case of a battery of lithium iron phosphate (LFP) technology, is a graph showing:

a first curve representing the trend, during aging, of the state of health SOH of such a battery—expressed by the discharged capacity of the battery related to its value when new; and a second curve representing the trend of the duration $T_{CV}$ of the constant voltage phase of the recharge—also related to its value when new.

It can be seen that the curves are very close. Consequently, in this case, an estimation of the state of health can be deduced directly from the duration of the phase of recharging at constant voltage related to its value when new.

Whatever the embodiment considered, the relationship between the parameter characteristic of the step of recharging at constant voltage (parameter B or duration of the step) need not necessarily be expressed by a linear or nonlinear mathematical function; it can also be, for example, a look-up table.

Figure 8:
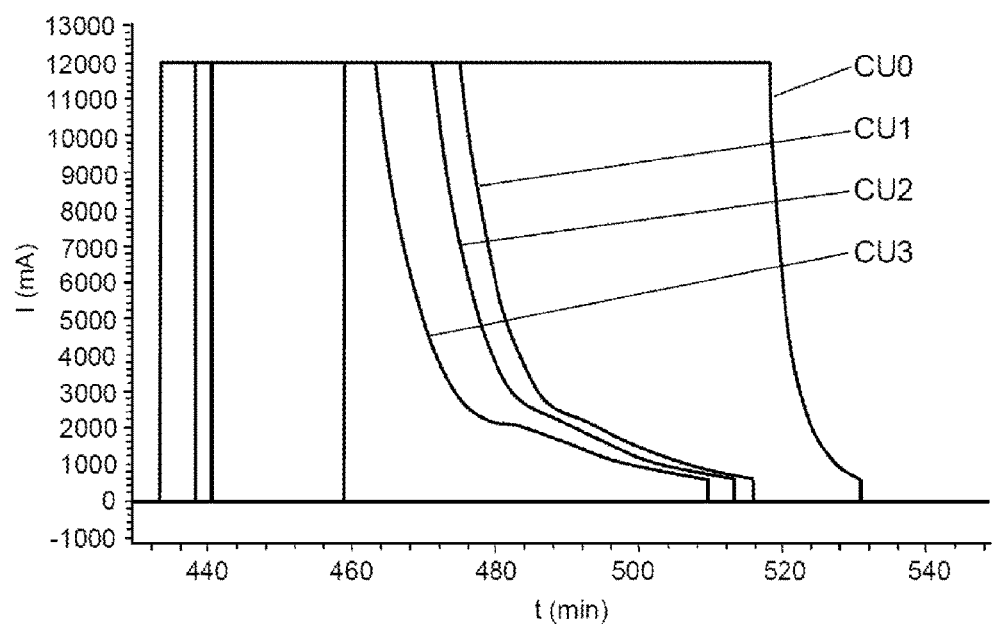
FIG. 8, curves illustrating the trend over time of the charging current during the charging of NMC batteries at different stages of aging.

In the case of a battery of NMC (nickel manganese and cobalt lithium-ion) type, furthermore, an advanced state of aging can be identified by detecting a deviation of the curve I(t) in CV phase relative to a decreasing exponential. This deviation takes the form of an inflection (change of convexity) or "boss" which occurs after a phase of rapid decrease of the current. This effect is illustrated in FIG. 8, where the curves CU0, CU1, CU2 and CU3 correspond to different states of a Li-ion NMC battery. More specifically, the curve CU0 corresponds to the new battery, the curve CU1 to the battery after a storage of 770 days at maximum charge and at a temperature of 45° C., the curve CU2 to the battery after a storage of 920 days in the same conditions and the curve CU3 to the battery after a storage of 1060 days, still in the same conditions. The curves have been staggered in time to facilitate their identification. It will be noted that, in the case of the new battery (curve CU0), the decrease of charging current during the CV phase is well described by an exponential law characterized by a certain value of the decrease parameter B. As the battery ages, the parameter B decreases (the decrease in the current becomes slower), but, above all, the appearance of an increasingly pronounced "boss" is observed, rendering the exponential law less relevant. It can be considered that the curve CU3—for which said exponential law is clearly not a satisfactory approximation—corresponds to the end of the useful life of the battery.

Thus—in addition to or instead of the estimation of the state of health of the battery from the parameter B—an advanced state of aging can be identified by detecting the appearance of an inflection in the curve I(t) during the CV phase of the recharge. This detection can be performed by simple observation of the curve or, preferably, automatically, by computation of a parameter representative of the deviation of said curve by a decreasing exponential and comparison of the value of this parameter to a reference value. This parameter can be, for example, a quadratic deviation between the measured current and its interpolation by an exponential function.

It can be assumed that the inflection in the decrease of the current during the CV phase of the recharge is due to a slowing down of the insertion of the lithium ions provoked by the growth of a solid electrolyte layer at the anode.

Figure 7:
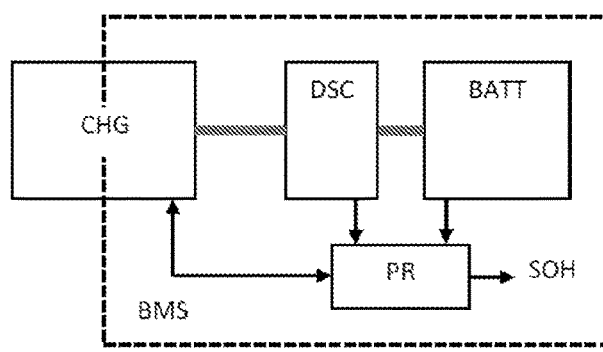
FIG. 7, a functional diagram of an apparatus for assessing the state of health of a battery according to an embodiment of the invention, incorporated in a battery management system.

FIG. 7 illustrates the functional diagram of an apparatus according to an embodiment of the invention, incorporated in a battery management system BMS, for example in an electric or hybrid vehicle. The device comprises a conventional charger CHG of the constant current—constant voltage type, charging a lithium battery BATT; a charge monitoring device DSC and a data processing device, or processor, PR. The monitoring device DSC comprises, for example, a current sensor, for measuring the charging current I, and a voltage sensor, for measuring the voltage U at the terminals of the battery BATT. This device can be incorporated in the charger CHG or in the battery BATT. The data processing device PR (preferably, a digital processor or an electronic board comprising such a processor) is programmed and/or configured to receive the measurements from the charge monitoring device and to use the latter to compute an indicator SOH of the state of health of the battery as has been described above. The processor PR can also drive the charger CHG, for example by controlling the transition between the first step of charging at constant current and the second step of charging at constant voltage, as well as the stopping of the charging when I(t) reaches its minimum value $I_{min}$.

The invention claimed is:

1. A method for assessing a state of health of a lithium battery comprising:

a) a first step of recharging said battery at constant current, until a voltage at its terminals reaches a limit value; then b) a second step of recharging said battery at constant voltage equal to said limit value, until a charging current drops below a threshold value, a plurality of measurements of the charging current being acquired during said second recharging step; and c) a step of estimating the state of health of said battery from said measurements of the charging current acquired during said second step of recharging at constant voltage;

wherein said step c) of estimating the state of health of said battery comprises the following substeps:

c1) estimating a constant of decrease B of a negative exponential function interpolating said measurements of the charging current as a function of time; and c2) estimating said state of health from said constant of decrease B.

2. The method of claim 1, wherein said substep c2 is implemented by a linear function linking said constant of decrease B to a loss of capacity of said battery.

3. The method of claim 1, also comprising a preliminary calibration step, comprising determining a relationship linking said or each said parameter characteristic of said second step of recharging at constant voltage to said state of health of the battery.

4. The method of claim 1, wherein said battery is a lithium-ion battery.

5. The method of claim 4, wherein said battery is a nickel, manganese and cobalt lithium-ion battery, the method also comprising:
   d) a step of detecting an inflection in a curve representing said measurements of the charging current acquired during said second step of recharging at constant voltage.

6. An apparatus for assessing a state of health of a lithium battery comprising:
   a charger of a constant current-constant voltage type, configured to charge one said battery at constant current until a voltage at its terminals reaches a limit value, then at constant voltage equal to said limit value until a charging current drops below a threshold value;
   a device for monitoring a recharging of said battery; and
   a data processing device configured or programmed to cooperate with said charger and with said monitoring device in order to implement a method for assessing the state of health of a lithium battery comprising:
   a) a first step of recharging said battery at constant current, until the voltage at its terminals reaches a limit value; then
   b) a second step of recharging said battery at constant voltage equal to said limit value, until a charging current drops below a threshold value, a plurality of measurements of the charging current being acquired during said second recharging step; and
   c) a step of estimating the state of health of said battery from said measurements of the charging current acquired during said second step of recharging at constant voltage;
   wherein said step c) of estimating the state of health of said battery comprises the following substeps:
   c1) estimating the constant of decrease B of a negative exponential function interpolating said measurements of the charging current as a function of time; and
   c2) estimating said state of health from said constant of decrease B.

7. A battery management system, said system being configured for assessing a state of health of a lithium battery and comprising:
   a charger of a constant current-constant voltage type, configured to charge one said battery at constant current until a voltage at its terminals reaches a limit value, then at constant voltage equal to said limit value until a charging current drops below a threshold value;
   a device for monitoring a recharging of said battery; and
   a data processing device configured or programmed to cooperate with said charger and with said monitoring device in order to implement a method for assessing the state of health of a lithium battery comprising:
   a) a first step of recharging said battery at constant current, until the voltage at its terminals reaches a limit value; then
   b) a second step of recharging said battery at constant voltage equal to said limit value, until a charging current drops below a threshold value, a plurality of measurements of the charging current being acquired during said second recharging step; and
   c) a step of estimating the state of health of said battery from said measurements of the charging current acquired during said second step of recharging at constant voltage;
   wherein said step c) of estimating the state of health of said battery comprises the following substeps:
   c1) estimating the constant of decrease B of a negative exponential function interpolating said measurements of the charging current as a function of time; and
   c2) estimating said state of health from said constant of decrease B.

* * * * *